United States Patent [19]

Maruyama et al.

[11] Patent Number: 5,830,623

[45] Date of Patent: Nov. 3, 1998

[54] PATTERN LITHOGRAPHY METHOD

[75] Inventors: Yumiko Maruyama, Fujisawa; Takahiro Ikeda, Yokohama, both of Japan

[73] Assignee: Kabushiki Kaisha Toshiba, Kawasaki, Japan

[21] Appl. No.: 715,375

[22] Filed: Sep. 12, 1996

[30] Foreign Application Priority Data

Sep. 12, 1995 [JP] Japan .................................. 7-234164
Jul. 11, 1996 [JP] Japan .................................. 8-182330

[51] Int. Cl.$^6$ ...................................................... G03C 5/00
[52] U.S. Cl. ...................... 430/322; 430/273.1; 430/909; 430/950
[58] Field of Search ..................... 430/322, 325, 430/273.1, 909, 950

[56] References Cited

U.S. PATENT DOCUMENTS

| | | | |
|---|---|---|---|
| 5,529,888 | 6/1996 | Watanabe et al. | 430/331 |
| 5,541,037 | 7/1996 | Hatakeyama et al. | 430/273.1 |
| 5,652,297 | 7/1997 | McCulloch et al. | 524/555 |

FOREIGN PATENT DOCUMENTS

| | | |
|---|---|---|
| 60-38821 | 2/1985 | Japan . |
| 60-223121 | 11/1985 | Japan . |
| 62-062521 | 3/1987 | Japan . |
| 62-62520 | 3/1987 | Japan . |
| 62-62521 | 3/1987 | Japan . |
| 5-74700 | 3/1993 | Japan . |
| 5-182905 | 7/1993 | Japan . |
| 5-188598 | 7/1993 | Japan . |
| 5-343315 | 12/1993 | Japan . |
| 6-51523 | 2/1994 | Japan . |

OTHER PUBLICATIONS

T. Tanaka et al., "A New Photolithography Technique with Antireflective Coating on Resist: ARCOR".
J. Electrochem. Soc, vol. 137, No. 12, Dec. 1990, pp. 3900–3904.
T. A. Brunner et al., "A Top Antireflector Process for Improved Linewidth Control and Alignment", J. Vac. Sci. Technol., vol. 9, No. 6, Nov./Dec. 1991, pp. 3418–3422.

*Primary Examiner*—Janet C. Baxter
*Assistant Examiner*—Rosemary Ashton
*Attorney, Agent, or Firm*—Foley & Lardner

[57] ABSTRACT

It is an object of the present invention to obtain a resist pattern of a high dimensional accuracy. In order to accomplish this object, a pattern lithography method according to the present invention comprises the steps of: forming a resist film 2 on a substrate 1 to be processed; applying a hydrous polymer solution 4 on the resist film 2; cross-linking polymers in the hydrous polymer solution to form a hydrogel film 4*a* of a predetermined thickness; and pattern-exposing the resist film 2 through the hydrogel film, and then, removing the hydrogel film 4*a*.

15 Claims, 14 Drawing Sheets

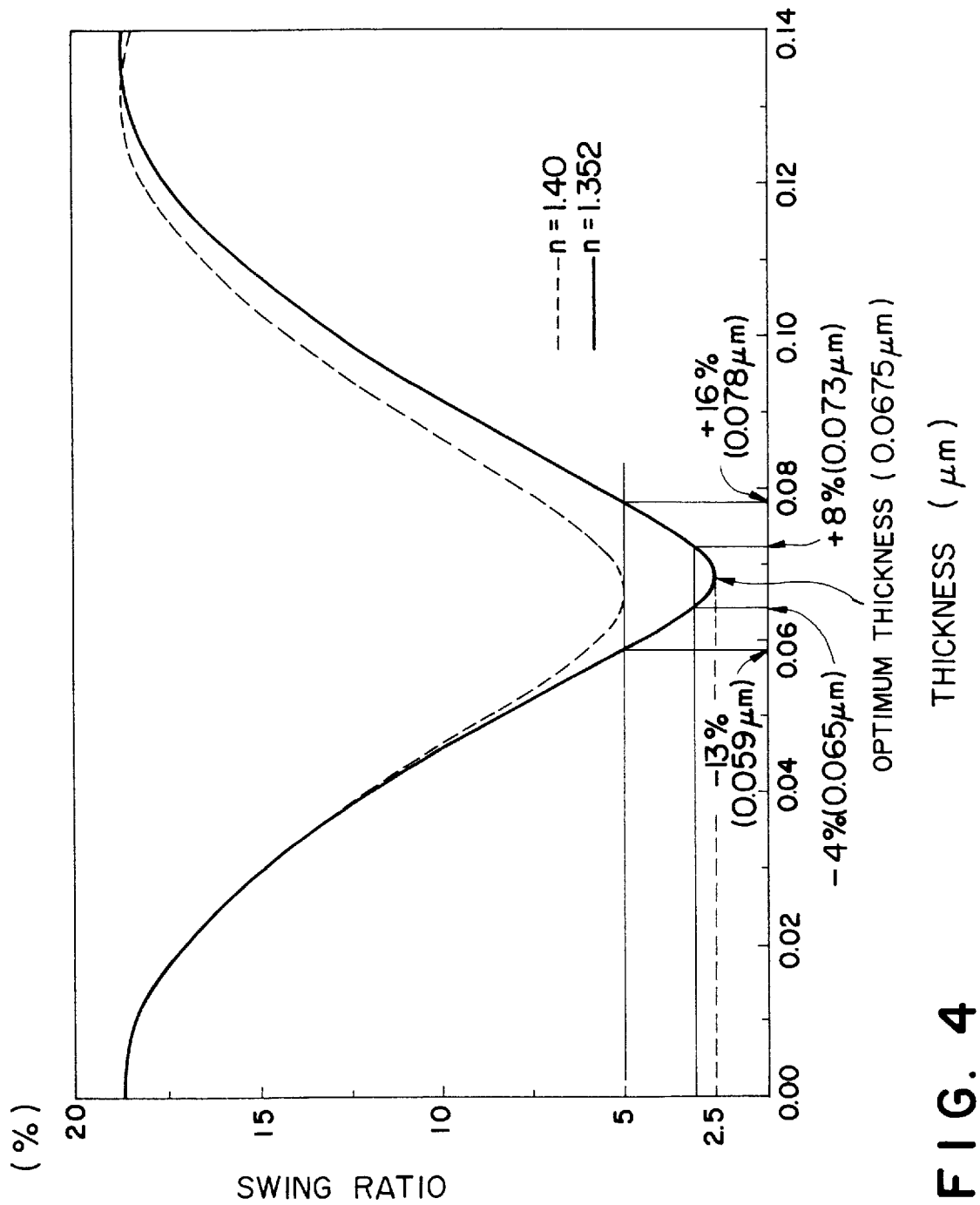
F I G. 4

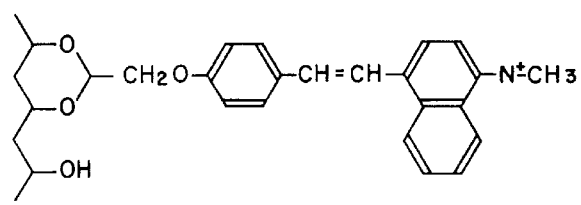
FIG. 11
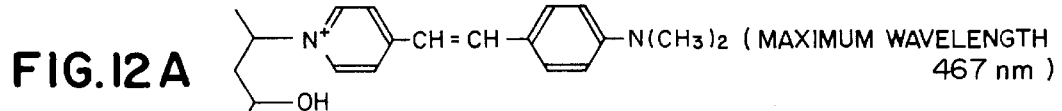
FIG.12A  (MAXIMUM WAVELENGTH 467 nm)
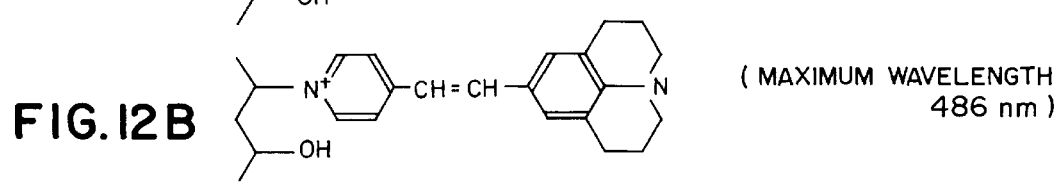
FIG.12B  (MAXIMUM WAVELENGTH 486 nm)
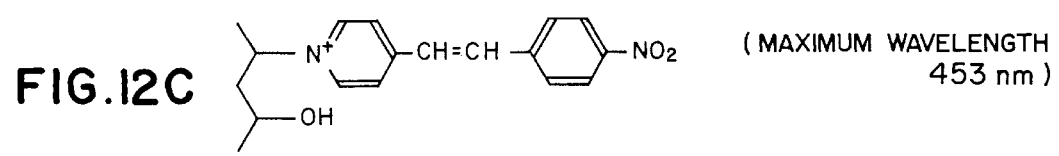
FIG.12C  (MAXIMUM WAVELENGTH 453 nm)

| BASE POLYMER | CROSS LINKING AGENT |
|---|---|
| POLYMERS HAVING-OH GROUP (PVA, CELLULOSE, ETC.) | ALDEHYDE, N-METHYLOL COMPOUNDS, DICARBOXYLIC ACID, CHLORIDE DICARBOXYLATE BISHALIDE, BISEPOXIDE, BISAZIRIDINE, DIMETHYLOL ETHYLENE, UREA, DIMETHYLOL UREA |
| PARTICULARLY, PVA | EPICHLOROHYDRIN, BORIC ACID, BORAX, $CuSO_4 + NH_3$ |
| POLYMERS HAVING-COOH GROUP (POLYACRYLIC ACID, POLYMETHACRYLIC ACID, AND COPOLYMER THEREOF, COPOLYMER OF ACRYLONITRILE AND ACRYLIC ACID, COPOLYMER OF STYRENE AND MALEIC ANHYDRIDE, ETC.) | DIOL, BISEPOXIDE, ALIPHATIC DICARBIMIDE, AROMATIC DICARBIMIDE |
| PARTICULARLY, COPOLYMER OF ACRYLIC ACID AND METHACRYLIC ACID, | DIVALENT OR MULTIVALENT METALLIC OXIDE, ORGANIC ACID SALT (Me(OR)$_2$) |
| COPOLYMER OF ACRYLONITRILE AND ACRYLIC ACID, AND COPOLYMER OF STYRENE AND MALEIC ANHYDRIDE | DIAMINE |
| POLYMER HAVING IMINO GROUP, AMINO GROUP POLYAMIDE | DIISOCYANATE |

FIG. 13

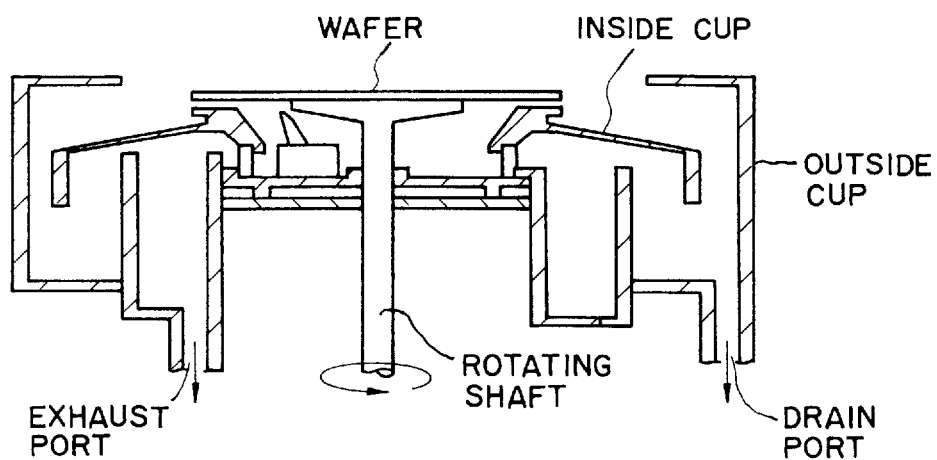
F I G. 14
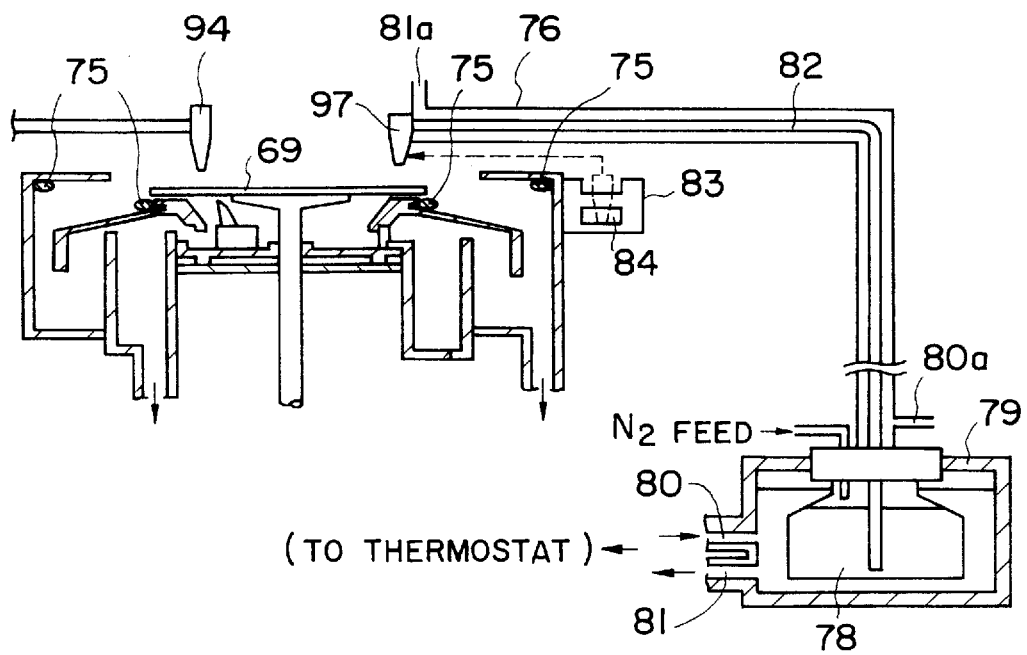
F I G. 15

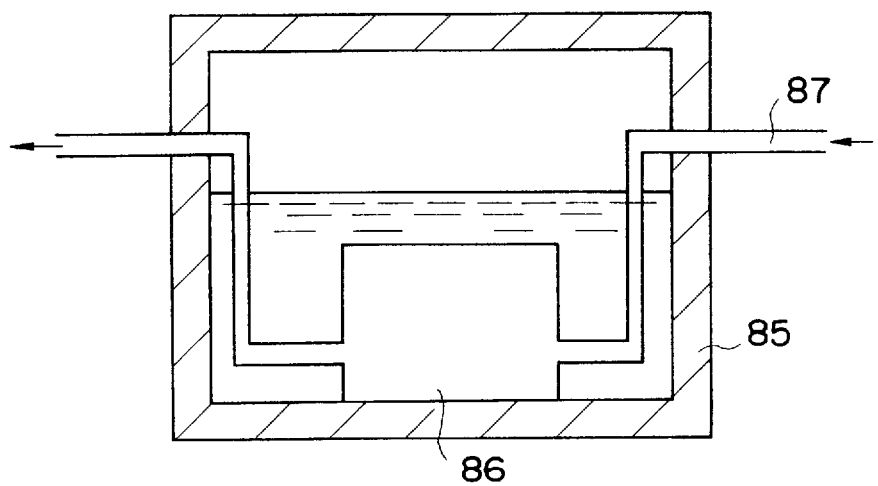
F I G. 16
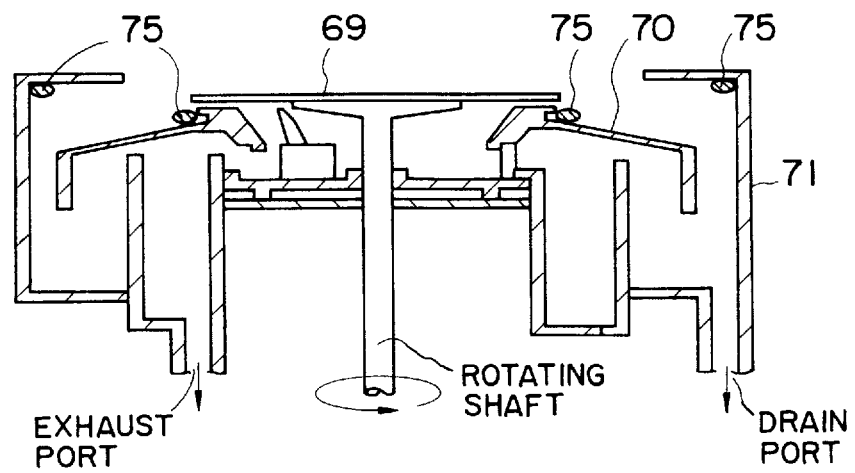
F I G. 17

10

PATTERN LITHOGRAPHY METHOD

BACKGROUND OF THE INVENTION

1. Field of The Invention

The present invention relates to a substrate processing apparatus and a pattern lithography method in a photo resist.

2. Description of The Prior Art

In general, photolithography technique is used as a photoresist pattern lithography which is used in the fabrication of a semiconductor integrated circuit. The size of pattern decreases with the integration of the circuit, so that it is more important to accurately control the size of pattern.

When a photo resist is exposed to light, the exposure light is multiple-reflected in the resist film, so that the size of pattern changes with the change of the thickness of the resist film. In order to prevent such change, after an anti-reflection coating is formed on the resist film, the resist film is exposed and developed to form a pattern therein. For example, as shown in FIG. 5, when an anti-reflection coating 3 is formed on a processed substrate 1 on which a photo resist film 2 is formed, an exposure light 6 passing through the photo resist film 2 is reflected on the interface between the processed substrate 1 and the resist film 2 to be a reflected light 7. A part of the reflected light 7 is reflected on the interface between the resist film 2 and the anti-reflection coating 3 to travel through the photo resist film 2 again as a reflected light 8. On the other hand, the residual light 9 is reflected on the interface between the anti-reflection coating 3 and the atmosphere to be transmitted through the interface between the anti-reflection coating 3 and the photo resist film 2. Then, the reflected light 8 interferes with the transmitted light 9 to cancel each other out, so that the multiple reflection in the photo resist film 2 is decreased.

In such a method providing the anti-reflection coating 3, assuming that the wavelength of the exposure light 6 is λ, the aforementioned effect increases as the refractive index $n_T$ of the anti-reflection coating 3 approaches $(n_R)^{0.5}$ and as the thickness d of the anti-reflection coating 3 approaches $\lambda/(4n_T)$ multiplied by an odd number. Since the refractive index of a novolac photo resist which is one of the presently used photo resists is about 1.7, the most preferred material as the anti-reflection coating has $n_T = 1.3$. The range of materials proposed as the anti-reflection coating 3 includes polysiloxanes (Japanese Patent Laid-Open No. 60-38821), polyethylvinyl ethers (PEVE), perfluoroalkyl polyethers (PFAE), polyvinyl alcohols (PVA) (See Tanaka et.al., J. Electrochem. Soc., 137,12, PP3900, 1990). For example, at a wavelength of 546 nm, the refractive indexes of these materials are 1.43, 1.48, 1.29 and 1.52, respectively, and the refractive index of PFAE extremely approximates to 1.3. Furthermore, in g-line (436 nm) and i-line (365 nm), the refractive indexes of PEVE, PFAE, PVA and polysiloxane are the same as those at 546 nm.

However, in order to remove the PFAE, freon must be used. Freon is an environmentally undesirable material. In order to remove the polysiloxane, organic solvents such as xylene must be used. If these organic solvents are used, there is a problem in that the upper layer of the resist film 2 is dissolved therein when the anti-reflection coating is peeled, so that the dimensional accuracy is not so good. In addition, water is another material having a refractive index of 1.3 (refractive index n=1.342, λ=365 nm), and a method using water as the anti-reflection coating has been proposed (see Japanese Patent Laid-Open No. 5-343315). However, since water is vaporized during the exposure so as to vary the thickness of film, it is not possible to obtain a resist pattern of a high dimensional accuracy, so that this method is not practical.

SUMMARY OF THE INVENTION

It is therefore an object of the present invention to eliminate the aforementioned problems and to provide a pattern lithography method which can obtain a resist pattern of a high dimensional accuracy, and a substrate processing apparatus which can be used for the practice of the pattern lithography method.

In order to accomplish the aforementioned and other objects, according to one aspect of the present invention, a pattern lithography method comprises the steps of: forming a resist film on a substrate to be processed; applying a hydrous polymer solution on the resist film; cross-linking polymers in the hydrous polymer solution to form a hydrogel film of a predetermined thickness; and pattern-exposing the resist film through the hydrogel film, and then, removing the hydrogel film.

According to this pattern lithography method, after the hydrous polymer solution is applied on the resist film, the cross-linking is conducted to form a hydrogel film of a predetermined thickness. Since this hydrogel film is a water retentive gel, its refractive index may be approximated to the refractive index of water, without changing the thickness of the film, and it is possible to obtain a film of a high dimensional accuracy.

The hydrogel film may be formed by forming physical bonds between polymers in the hydrous polymer solution by a reversible reaction to cross-link the polymers.

The hydrogel film forming step may comprise the steps of: forming chemical bonds between polymers in the hydrous polymer solution by an irreversible reaction to cross-link the polymers so that the density of cross-linked points based on the chemical bonds is less than the density of cross-linked points at a gel point of the hydrous polymer; and forming physical bonds between polymers in the hydrous polymers solution by a reversible reaction to cross-link the polymers.

The cross-linking step by the irreversible reaction may use a photo cross-linking reaction.

The cross-linking step by the irreversible reaction may use a cross-linking agent.

The hydrous polymer may be selected from the group consisting of polysaccharides, proteins, polyvinyl alcohols and poly acrylamides.

The hydrous polymer may be a polymer which reversibly causes a sol-gel transformation.

The hydrous polymer may be a mixture in a sol state formed by mixing a first polymer that gelation is conducted by an irreversible reaction, with a second polymer which causes a reversible sol-gel transformation.

According to another aspect of the present invention, a substrate processing apparatus comprises: supporting means for supporting a substrate thereon; rotating means for rotating the substrate; storage means for storing a chemical which is applied on the substrate; a line for supplying the chemical stored in the storage means, to the substrate supported on the supporting means; discharging means for discharging the chemical supplied via the line, onto the substrate; cooling means for cooling the substrate to maintain the temperature of the substrate at a first temperature below a room temperature; and chemical temperature adjusting means for adjusting the temperatures of the chemical stored in the storage means, the chemical in the line, and the chemical discharged from the discharge means, at a temperature above the room temperature.

The substrate processing apparatus may further comprise means for removing a chemical overflowing the substrate, among the chemical discharged onto the substrate, by means of a liquid having an adjusted temperature.

The substrate processing apparatus may further comprise moist-air supplying means for supplying moist-air saturated with water vapor, to the substrate onto which the chemical is discharged.

The substrate processing apparatus may further comprise means for maintaining a partial pressure of water vapor in air surrounding the substrate which is cooled and maintained at the first temperature by the cooling means, at a saturation pressure at the first temperature or at a pressure less than the saturation pressure.

The substrate processing apparatus may further comprise means for supplying water having a temperature above the room temperature, to the substrate supported on the supporting means.

BRIEF DESCRIPTION OF THE DRAWINGS

In the drawings:

FIG. 4 is a graph showing the relationship between the thickness of the anti-reflection coating and the swing ratio thereof;

FIG. 11 is a chemical formula illustrating the structure of a polyvinyl alcohol having a oxystyrylquinolinium group;

FIGS. 12A through 12C are chemical formulae illustrating the structures of polyvinyl alcohols having styryl photosensitive groups;

FIG. 13 is a table showing polymers cross-linked by chemical reactions and cross-linking agents thereof;

FIG. 14 is a sectional view of a conventional spin coater;

FIG. 15 is a view of the preferred embodiment of a substrate processing apparatus according to the present invention;

FIG. 16 is a view illustrating a temperature adjusting mechanism in a chemical supplying system of the apparatus of FIG. 15;

FIG. 17 is a sectional view of a spin coater having a cup washing mechanism in the apparatus of FIG. 15;

DESCRIPTION OF THE PREFERRED EMBODIMENT

Figure 1A:
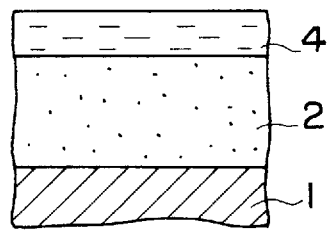
FIGS. 1A through 1F are sectional views illustrating the first preferred embodiment of a pattern lithography method according to the present invention.
Figure 1B:
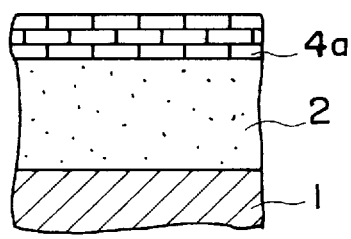

Referring now to the drawings, particularly to FIGS. 1A through 1F and 2 through 4, the first preferred embodiment of a pattern lithography method, according to the present invention, will be described below.

In this preferred embodiment, a polyvinyl alcohol (which will be hereinafter referred to as "PVA") which is a hydrous polymer having a saponification rate of 95 mol% and a polymerization degree of 2500, is used as an anti-reflection coating 4.

First, the PVA is dissolved in purified water to prepare a 5 wt% of PVA solution.

In general, when a hydrous polymer contains water, the refractive index $n_T$ of the mixture approaches the refractive index (1.343) of water as the proportion of water increases. Therefore, if such a polymer containing a great amount of water is used as the anti-reflection coating, it can be expected that the effect as the anti-reflection coating is greater than that of the conventional anti-reflection coating. For example, the refractive index $n_T$ of a 5 wt% of aqueous PVA solution ('saponification rate: 95 mol%) having a refractive index of 1.553 can be obtained as follows to be 1.352.

The dielectric constant $\epsilon$ of a multicomponent mixture system can be expressed as the following formula by the effective medium approximation, and on the basis of the relationship between this formula and $\epsilon = n^2$, the refractive index $n_T$ of the aforementioned aqueous solution can be derived.

$$V_P(\epsilon_P-\epsilon)/(\epsilon_p+2\epsilon) = V_s(\epsilon_s-\epsilon)/(\epsilon_s+2\epsilon)$$

wherein $V_P$ is the volumetric fraction of a polymer, $V_s$ being the volumetric fraction of a solvent (water), $\epsilon_p$ being the dielectric constant of the polymer, $\epsilon_s$ being the dielectric constant of the solvent (water), and $\epsilon$ being the dielectric constant of the aqueous solution.

Figure 2:
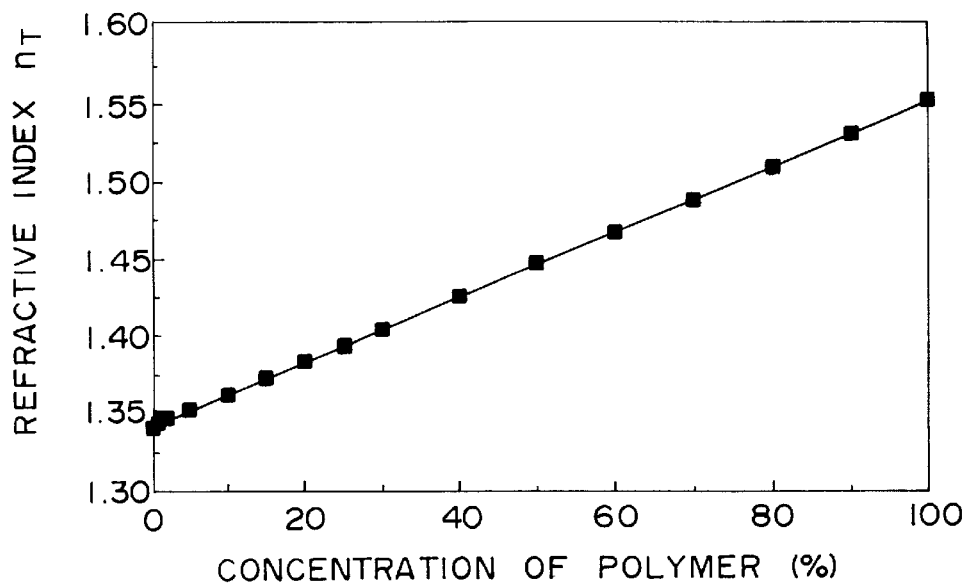
FIG. 2 is a graph showing the relationship between the refractive index of a polymer solution and the concentration of the polymer.

FIG. 2 shows the relationship between the values of $N_T$ and the concentrations of the polymer, which is derived by the aforementioned formula. As can be seen from FIG. 2, if the concentration of the polymer is only few percents, the refractive index of the solution can be approximated to the refractive index of water.

As mentioned above, after the 5 wt% of PVA solution is prepared, for example, a novolac resist is applied on the processed substrate 1 to form a resist film 2 thereon as shown in FIG. 1A. After this resist film 2 is pre-baked, the PVA solution 4 is applied thereon so as to have a predetermined thickness. Then, the substrate on which the PVA solution 4 is applied is allowed to stand for 1 hour at a temperature below −6° C. under atmospheric pressure, so that the PVA molecule is cross-linked to form a hydrogel film 4a having a moisture content of 95 wt% and a thickness of 67.5 nm on the resist film 2 (see FIG. 1B). In this case, the hydrogel film 4a allows an exposure light having a wavelength of 365 nm to be sufficiently transmitted, and has a refractive index of 1.352 (see FIG. 2) which approximates to the refractive index of water.

Alternatively, the substrate on which the PVA solution 4 is applied may be allowed to stand, for example, for a period of several hours to 10 hours at temperatures below −6° C. under pressures of 4 to 10 Nm−2, to solidify (freeze-dry) the PVA solution so that the PVA molecule is cross-linked to form the hydrogel film 4a on the resist film 2, and then, the substrate 1 may be immersed in water for 30 minutes to cause the hydrogel film 4a to swell therein so that the hydrogel film 4a has a moisture content of 95 wt% and a thickness of 67.5 nm. Furthermore, in a series of processes for freeze-drying and swelling, the change of the thickness is within about 2 %.

Figure 1C:
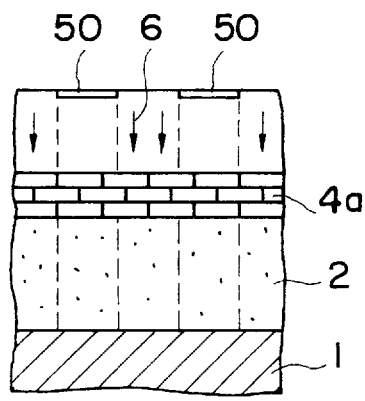
Figure 1D:
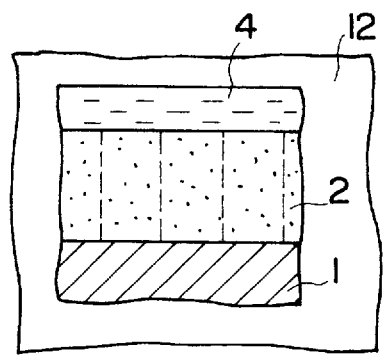
Figure 1E:
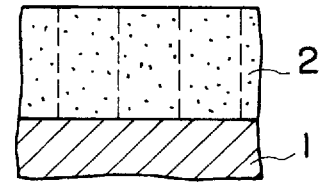
Figure 1F:
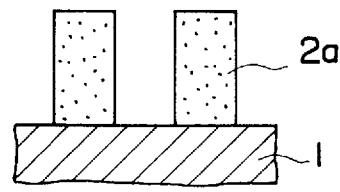

Then, after the mask alignment is carried out using a mask 50, it is exposed to light 6 having a wavelength 365 nm (see FIG. 1C). Thereafter, since the melting point of the PVA gel is 60° C., a boiling water 12 having, for example, a temperature above 80° C. is poured upon the hydrogel film 4a to remove the hydrogel film 4a as the PVA solution 4 (see FIG. 1D). Then, the post-exposure bake is conducted, for example, at temperatures of 90° C. to 110° C. (see Fig. 1E), and the development is accomplished to form a resist pattern 2a (see Fig. 1F). In this case, if the substrate is immersed in the boiling water 12 to remove the hydrogel film 4, this can also serve as the step for post-exposure bake.

Thus, according to the pattern lithography method in this preferred embodiment, since the PVA solution 4 applied on the resist film 2 is changed to the water-retentive hydrogel film 4a, it is possible to prevent water from being vaporized, so that the thickness and the refractive index of the hydrogel film 4a do not change. In addition, since this hydrogel film 4a is transformed from a gel to a water-soluble sol when the temperature is raised, this can be easily removed without damaging the resist and without destroying the environment.

Figure 3:
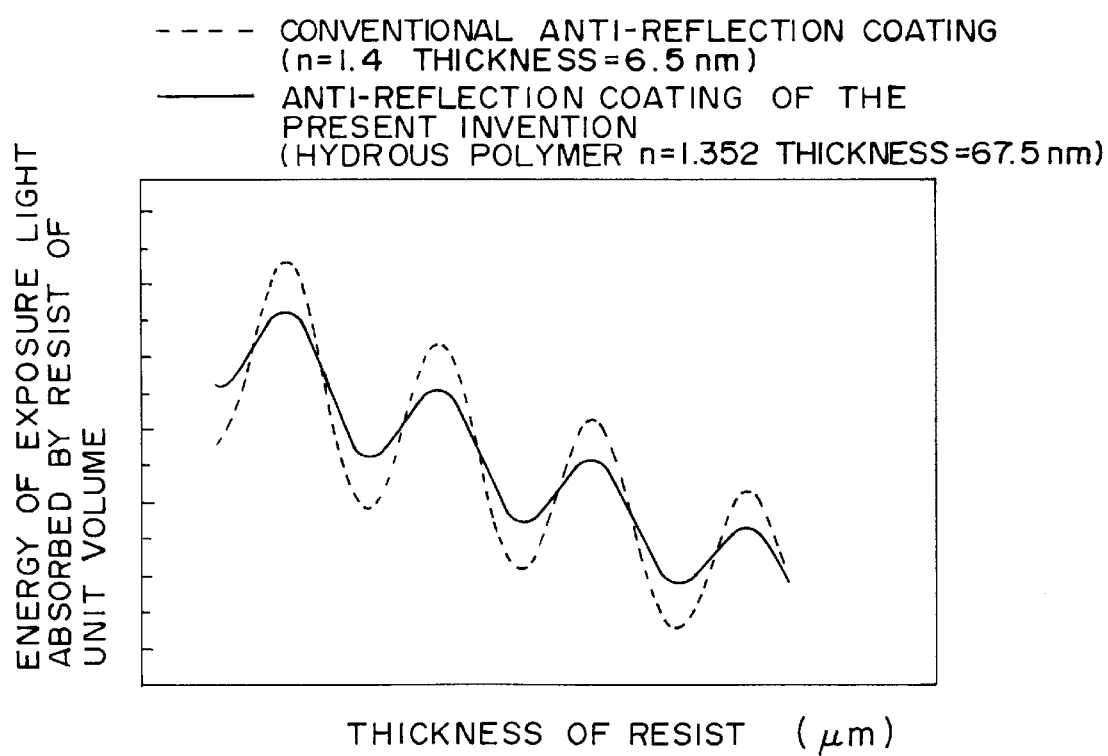
FIG. 3 is a graph showing the relationship between the thickness of the resist film and the energy of the exposure light absorbed by the resist of a unit volume when the anti-reflection coating of the present invention and the conventional anti-reflection coating are used.
Figure 5:
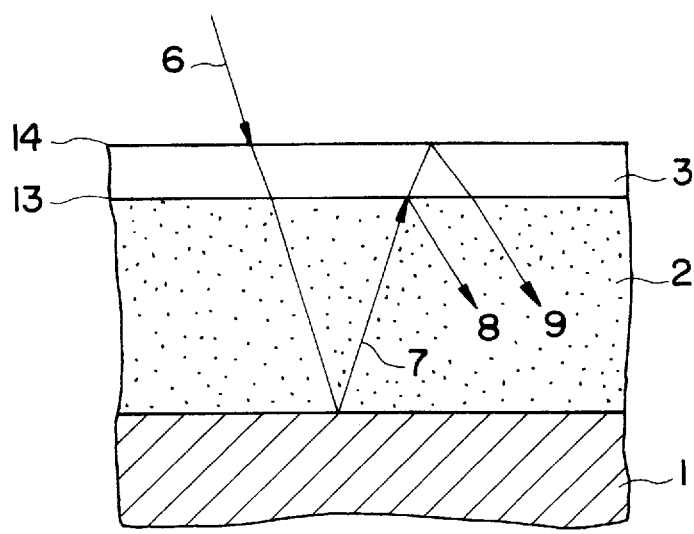
FIG. 5 is a view illustrating the principle of an anti-reflection coating.

FIG. 3 shows the relationship between the thickness of the resist film 2 and the calculated energy of the exposure light absorbed by the resist when the conventional anti-reflection coating 3 (refractive index: 1.4) and the anti-reflection coating 4 in this preferred embodiment (refractive index: 1.352) are used respectively. In this graph of FIG. 3, the energy of the exposure light absorbed by the resist per a unit volume is expressed by the axis of ordinates, and the change of the energy of the exposure light corresponds to the change of the size of the resist film 2. As can be seen from FIG. 3, when the hydrous polymer is used as the anti-reflection coating according to this preferred embodiment (see the solid line in FIG. 3), the amplitude of the change of the energy can be equal to about half of the conventional anti-reflection coating (see the broken line in FIG. 3).

As mentioned above, according to the pattern lithography method in this preferred embodiment, it is possible to obtain a resist pattern of a high dimensional accuracy without destroying the environment.

Furthermore, according to the pattern lithography method in this preferred embodiment, there is a slight change of volume when the gelation of the applied PVA solution is conducted. Therefore, the allowable change of volume is estimated as follows.

FIG. 4 shows the simulated results on the relationship between the thickness of the anti-reflection coating 4a and the swing ratio thereof. This swing ratio is a ratio of the value of the peak-to-valley to that of the average of peak and valley in one cycle of the periodic curve in FIG. 3 which shows the relationship between the thickness of the resist and the energy of the exposure light absorbed by the resist.

Therefore, as this swing ratio approximates to 0, the error of change of the energy of the absorbed light due to the change of the thickness of the resist is decreased so as to even easily ensure uniform exposure. The parameters used in the aforementioned simulation are as follows.

a) Wavelength $\lambda$ of Exposure Light: 0.356 $\mu$m b) Resist: Novolac Resin Refractive Index: 1.7070–0156$i$ Thickness of Film: 1.03±0.3$\mu$m c) Substrate: Silicon Refractive Index: 5.9602–2.9028$i$ Thickness of Film: 5.00$\mu$m d) Anti-Reflection Coating:

Present Invention: n=1.352 (Solid Line)

Prior Art: n=1.40 (Broken Line)

As can be seen from FIG. 4, if the change of the thickness of the anti-reflection coating 4a with respect to the optimum thickness of 67.5 nm is in the range of from −13% to +16% as the pattern lithography method in this preferred embodiment, the dimensional control effect is greater than that of the conventional anti-reflection coating. In addition, if the change of the thickness with respect to the optimum thickness is in the range of from −4% to +8%, the dimensional control effect is about twice as large as that of the conventional anti-reflection coating. In the case of a gelatin, the contraction in volume by gelation with respect to the volume of the aqueous solution is about 2% in the experimental results. With respect to other gels, it seems that the change in volume is substantially the same as that of the gelatin. Therefore, even if the thickness after the application of the PVA solution is the same as the optimum thickness of gel being 67.5 nm, it seems that good results can be obtained.

While the moisture content of the hydrogel film 4a has been 95 wt% or more in the aforementioned preferred embodiment, any hydrogels having a moisture content of 90 wt% or more may be used to obtain good results according to the inventor's knowledge.

The second preferred embodiment of a pattern lithography method, according to the present invention, will be described below. In this preferred embodiment, an aqueous gelatin solution is used as the hydrous polymer used as the anti-reflection coating 4.

First, a gelatin is dissolved in hot water having a temperature of 90° C. to prepare a 5 wt% of aqueous gelatin solution.

After a resist is applied on a silicon substrate in an usual manner to carry out the pre-bake thereof, the aqueous gelatin solution is applied thereon and allowed to stand for 1 hour at a temperature of −3° C. to conduct the gelation of the gelatin so as to form a hydrogel film having a thickness of 70 nm on the resist. This gelatin gel allows light having a wavelength of 365 nm to be sufficiently transmitted, and the refractive index thereof approximates to 1.3. Thereafter, similar to the first preferred embodiment, it is exposed to light of 365 nm. Then, after hot water having, for example, a temperature above 50° C. is poured thereon to remove the gelatin film, the post-exposure bake is conducted to form a resist pattern. In this case, if the substrate is impregnated with hot water to remove the gelatin film, this can also serve as the step for post-exposure bake. Since the melting point of the gelatin is about 40° C., if the developing solution can be heated to a temperature above 40° C., the step for removing the hydrogel film can also serve as the developing step. By these procedures, it is possible to form a pattern of a high dimensional accuracy which is not under the influence of any differences in level on the substrate, in comparison with when an anti-reflection coating of a hydrogel is not used.

The third preferred embodiment of a pattern lithography method, according to the present invention, will be described below. In this preferred embodiment, a κ-carrageenan solution is used as the hydrous polymer used as the anti-reflection coating.

First, κ-carrageenan is dissolved in an aqueous ammonium chloride solution at a temperature of 80° C. to prepare a 5 wt% of κ-carrageenan solution. Then, after a resist is applied on a substrate in an usual manner to conduct the pre-bake, the κ-carrageenan solution is applied on the resist to be allowed to stand for 20 minutes at a temperature of 0° C. to conduct the gelation so as to form a hydrogel film having a thickness of 67.5 nm. This carrageenan allows light of 365 nm to be sufficiently transmitted, and has a refractive index approximating to 1.3. Thereafter, similar to the first preferred embodiment, it is exposed to light of 365 nm. Then, after hot water having, for example, a temperature above 80° C. is poured to remove a carrageenan gel film, the post-exposure bake is conducted to form a resist pattern. In this case, if the substrate is impregnated with hot water to remove the carrageenan gel film, this can also serve as the step for post-exposure bake. By these procedures, it is possible to form a pattern of a high dimensional accuracy which is not under the influence of any differences in level on the substrate, in comparison with when an anti-reflection coating of a hydrogel is not used.

While a PVA, a gelatin and κ-carrageenan have been used as the hydrous polymer in the aforementioned preferred embodiments, agarose and polyacrylamides which can be easily gelated and removed after the application of the hydrous polymer may be used. In addition, while the wavelength for the exposure has been 365 nm in the aforementioned preferred embodiments, other wavelengths may be used as long as the anti-reflection coating fulfills the aforementioned anti-reflection conditions.

Moreover, while the novolac resin (refractive index n =1.7) serving as the photo resist has been described in the aforementioned preferred embodiments, the present invention should be limited thereto. The range of resists which will be used in future may include: (a) acrylic resins (e.g. poly(methyl methacrylate) (PMMA), refractive index n=1.501 ($\lambda$=436 nm)), (b) silicon containing resists (e.g. polysiloxane, refractive index n=1.43 (κ=546 nm)), and (c) fluorine containing resists (e.g. poly(hexafluorobuthyl methacrylate) (FBM), and perfluoroalkyl ether (PFAE) as a fluorocarbon resin containing fluorine, refractive index n=1.29 ($\lambda$=546 nm)). Thus, the refractive indexes of the resists which will be used in future may be less than the refractive index of the presently used resist (novolac resist). However, to these resists, the refractive index of the anti-reflection coating of the present invention approximates to the square root of the refractive index of the resist in comparison with the refractive index of the conventional water-soluble anti-reflection coating (e.g. PVA), so that it is considered that the effect may be increased.

In the aforementioned first through third preferred embodiments, the gel state of the hydrogel serving as the anti-reflection coating has been achieved by changing the environmental conditions such as the temperature of the aqueous polymer solution (a sol state) such as a polyvinyl alcohol to make bridges between polymer chains to form a three-dimensional network structure. In addition, the hydrous polymer which causes the reversible sol-gel transformation has been used since it is possible to easily remove the anti-reflection coating. Therefore, physical bonds, such as hydrogen bonds and bonds based on spiral structures between molecular chains, have been used as bonds between the polymer chains. Although such physical bonds can be achieved by temperature variation such as cooling, it generally takes a lot of time until the gelation is completed, and there are problems on the throughput, the stability and so forth. For example, when an aqueous gelatin solution is cooled, hydrogen bonds are produced between NH groups and CO groups in the polymer to form spiral structures between molecules to conduct the gelation. However, it takes several hours until the gelation is completed.

Figure 6:
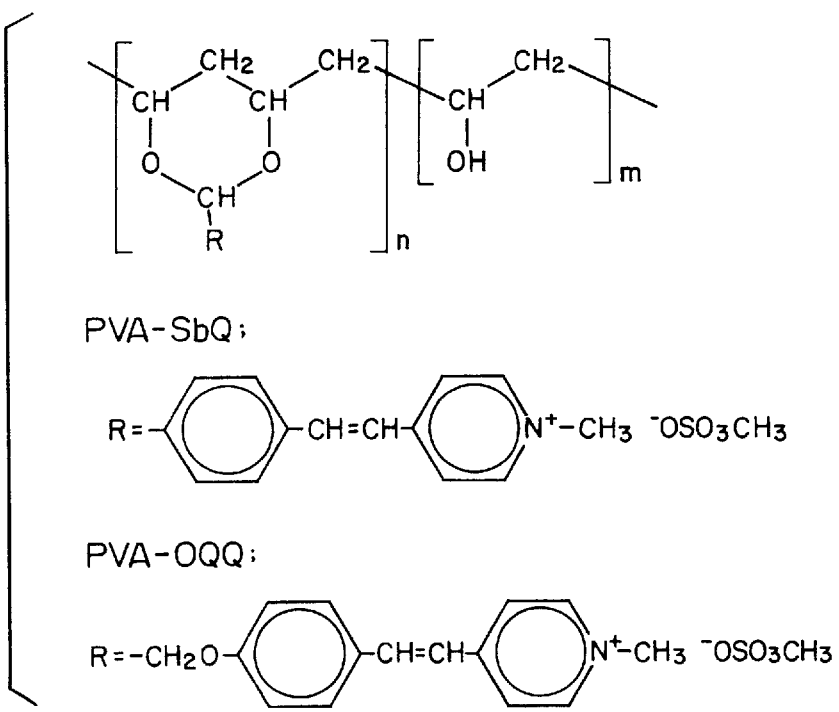
FIG. 6 shows chemical formulae of substances causing gelation by light.
Figure 7:
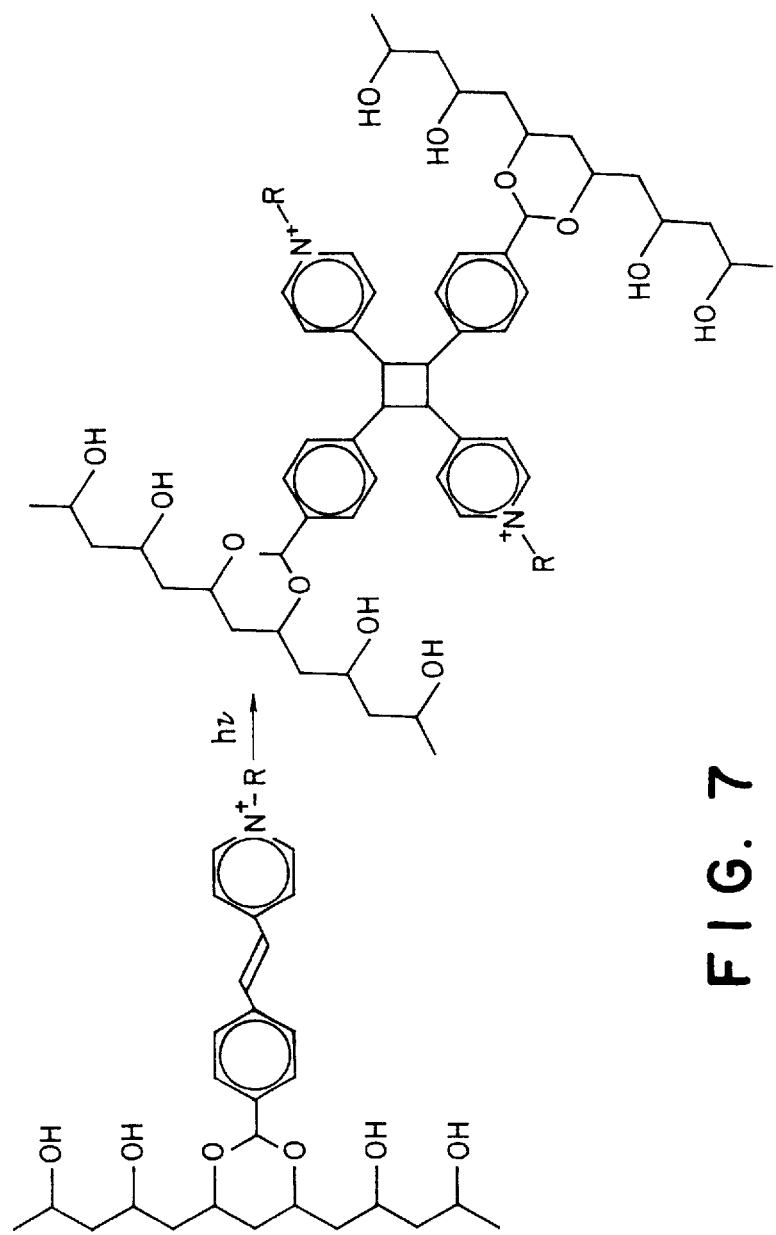
FIG. 7 is a view illustrating a photo cross-linking reaction in the substances of FIG. 6.

A method for cross-linking between the polymer chains to conduct gelation by means of light irradiation or a cross-linking agent can be proposed. This method can be quickly carried out. The range of gels cross-linked by light may include a polyvinyl alcohol containing quaternary stilbazolium groups (which will be hereinafter referred to as "PVA-SbQ") and a polyvinyl alcohol containing oxystyrylquinolinium groups, which has a similar structure thereto (which will be hereinafter referred to as "PVA-OQQ") (Ichimura, Polymer Processing, 23, 433, 1984). These materials have the structures as shown in FIG. 6. The dimerization reaction of stilbazolium groups introduced into the PVA chain is caused to form bridges by light energy. A network structure is formed by these cross-linked points so as to produce a gel (see FIG. 7). The period of time required for gelation is only few seconds. Since the cross-linked points are formed only by chemical bonds and since it is not required to change the high-degree structure of the polymer unlike gelatin, it is considered that gelation can be accomplished in a short period of time. However, since chemical bonds such as covalent bonds are formed, the sol-gel transformation is irreversible, so that it is difficult to remove the film when it is used as the anti-reflection coating.

Therefore, another pattern lithography method which can form a hydrogel film having an ideal refractive index as an anti-reflection coating formed on a photo resist in a shorter period of time and which can easily remove the film, will be described below.

Figure 8:
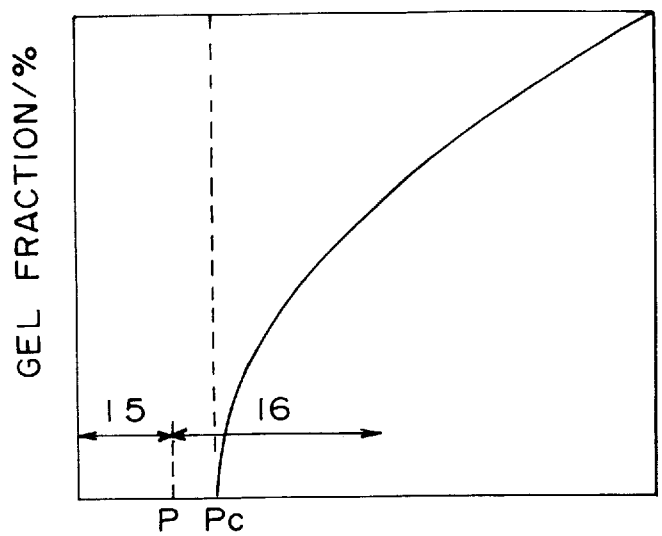
FIG. 8 is a graph showing the relationship between the density of cross-linked points and the gel fraction.

FIG. 8 shows the relationship between the gel fraction of a solution and the density of cross-linked points in a polymer solution. When the cross-linking proceeds to some extent, it is spread over the whole network, so that the fluidity of the polymer solution is lost (the viscosity is abruptly increased). The gel fraction is a ratio of the number of primary molecules (molecules before the cross-linking between molecules occurs) which belongs to an infinite network spread over the whole system, to the number of the primary molecules in the whole system. The point at which the polymer belonging to the infinite network appears will be referred to as a "gel point", and it is assumed that the density of cross-linked points (the number of cross-linked points per a unit volume) at the gel point is $P_c$ (see FIG. 8). In a pattern lithography method which will be described below, cross-linked points based on chemical bonds are formed by adding a cross-linking agent or by irradiating light so that the density P of the cross-linked points is less than $P_c$ ($P<P_c$) (the region expressed by 15 in FIG. 8). In this state, the polymer solution is still a "sol state". Thereafter, in a manner such as cooling, the reversible sol-gel transformation is conducted to form a hydrogel film (the region expressed by 16 in FIG. 8). Furthermore, the order of gelation may be either the order of the reversible or irreversible step. By conducting a part of a cross-linking reaction by adding a cross-linking agent or by irradiating light, the gelation can be conducted in a shorter period of time than that occurring by conducting the whole cross-linking reaction by the variation in temperature. After the pattern exposure, the gel can be transformed into a sol to be removed by varying the temperature.

In order to realize the state in which the density of cross-linked points is less than the density $P_c$ of cross-linked points at the gel point, the following procedure may be conducted. That is, if the density of cross-linked points is less than the density $P_c$ of cross-linked point at the gel point, the state of the polymer solution is the sol state, and if it is not so, the state of the polymer solution is the gel. Therefore, if the gel point can be determined, the aforementioned state can be realized. In order to determine the gel point, the falling ball method, a method for measuring viscosity, a method for measuring elasticity, and a method for determining an average molecular weight by light scattering, are generally used. For example, in the case of a system in which the cross-linking occurs by light, the quantity of irradiation is gradually increased. In the case of the falling ball method, it is determined whether a ball falls, so that the state at which the ball first does not fall is the gel point. In the case of the method for measuring viscosity, the state at which the viscosity of the solution diverges infinitely is the gel point. In the case of the method for measuring elasticity, the state at which the elasticity varies from zero to a certain finite value is the gel point. In the case of the method for determining an average molecular weight by light scattering, the state at which the average molecular weight diverges infinitely is the gel point. Thus, the gel point is determined, and the quantity of irradiation at the gel point is examined, so that the relationship between the quantity of irradiation at the gel point and the quantity of irradiation in the sol state is determined. As the quantity of irradiation increases, the cross-linking reaction proceeds. Therefore, if the quantity of irradiation less than that at the gel point is set, the sample is in the sol state, so that the relationship $P<P_c$ can be realized.

Alternatively, for example, when a sol is formed by mixing, for example, polyacrylamide in which gelation occurs by covalent bonds, with a gelatin which causes the reversible sol-gel transformation, to conduct gelation by the variation in temperature, the relationship between the concentration of an irreversible gel and the gel point may be examined to determine the concentration realizing $P<P_c$ in the same manner as the aforementioned manner. In addition, in the system in which chemical bonds are formed by adding a cross-linking agent, since the cross-linking density depends upon the amount of the added cross-linking agent, the amount of the cross-linking agent at the gel point may be derived in the aforementioned manner to add a smaller amount of cross-linking agent than the derived amount in practice.

For example, with respect to the aforementioned polymer cross-linked by light, if the introduced rate of SbQ or OQQ group is sufficiently small, a complete gelation is not reached even if it is irradiated with light to cause the cross-linking reaction. Therefore, after gelation is conducted by cooling or the like to utilize the resulting film as an anti-reflection coating, it can be transformed into a sol to be removed.

Another preferred embodiment of a pattern lithography method for forming an anti-reflection coating using both of such reversible and irreversible means, according to the present invention, will be described below.

Referring to FIGS. 9 and 10A through 10G, the fourth preferred embodiment of a pattern lithography method, according to the present invention, will be described. In this preferred embodiment, a 5 wt% of aqueous solution of a polyvinyl alcohol into which oxystyrylquinolinium groups are introduced is used as a hydrous polymer forming an anti-reflection coating. Before applying the hydrous polymer as the anti-reflection coating in practice, the introduced rate of photosensitive groups and the quantity of irradiation when cross-linked by light are determined in the following manner. The wavelength of light which causes the aforementioned polymer to be cross-linked is close to that of light which causes the photosensitive reaction of the resist. Therefore, the irradiation light to which the resist is exposed also accelerates the cross-linking of the aforementioned polymer. Taking into account the influence upon the resist, the quantity of irradiation should be small. Therefore, although the sensitivity of the aforementioned polymer should be good, it is required to suppress the cross-linking density to such an extent that gelation does not occur when the resist is exposed to light. Accordingly, the introduced rate of photosensitive groups is so determined as to be 0.8 mol% at which gelation does not occur in the extent of the quantity of irradiation for exposing the resist to light. In this case, it is determined by the falling ball method whether the gelation occurs. That is, after a polymer solution is placed in a vessel to be irradiated with light, a small ball is slowly placed on the surface of the solution, so that it is examined whether the ball sinks to determine whether gelation occurs.

Figure 9:
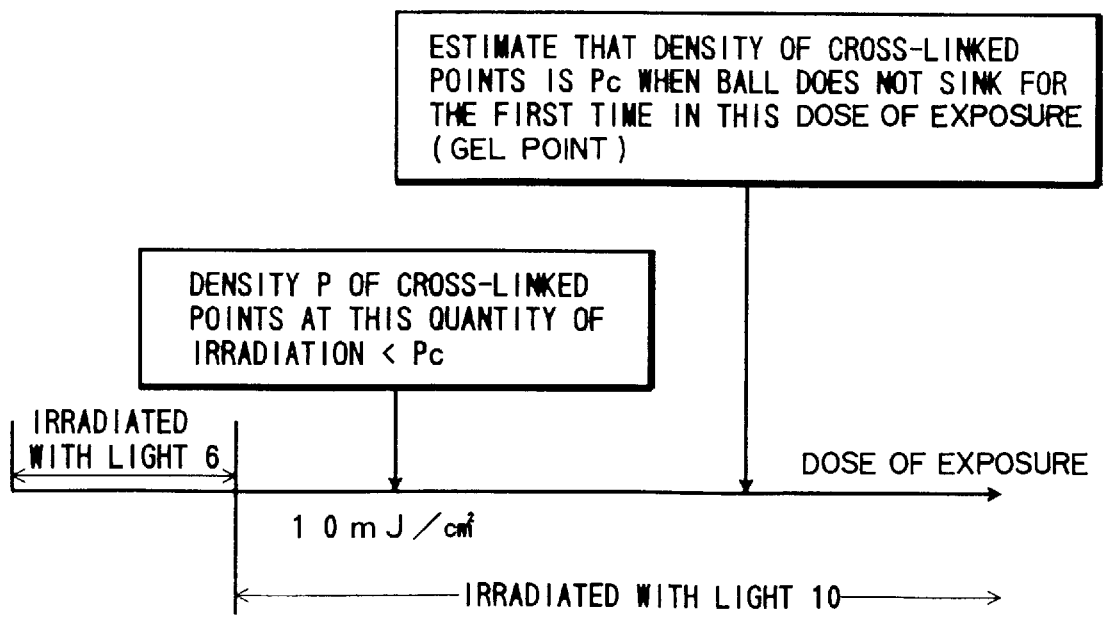
FIG. 9 is a view illustrating a method for determining a gel point.

In addition, taking into account the quantity of irradiation for exposing the resist to light, the quantity of irradiation for cross-linking the aforementioned polymer is determined by the following experiments. That is, after the aforementioned polymer solution is irradiated with light to which the resist is exposed, it is irradiated with light for the cross-linking. The gel point is derived by varying the quantity of irradiation. Furthermore, the gel point is determined by the falling ball method. As shown in FIG. 9, the quantity of irradiation of light 10 is increased. When the ball first does not sink, it is determined that the cross-linking density reaches $P_c$ in this quantity of irradiation (gel point), and that the quantity of irradiation of light 10 for the cross-linking of the aforementioned polymer is 10 mJ/cm² which is sufficiently smaller than the quantity of irradiation at the gel point so that the cross-linking density P is less than $P_c$ ($P<P_c$) While the gel point has been determined by the falling ball method in this preferred embodiment, the method for determining the gel point on the basis of the viscosity of the solution may be used. Alternatively, it may be determined by the light scattering method.

Figure 10A:
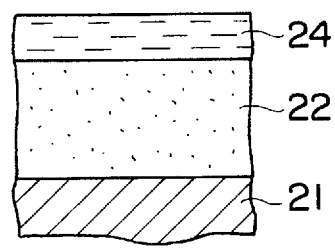
FIGS. 10A through 10G are sectional views illustrating the fourth preferred embodiment of a pattern lithography method according to the present invention.
Figure 10B:
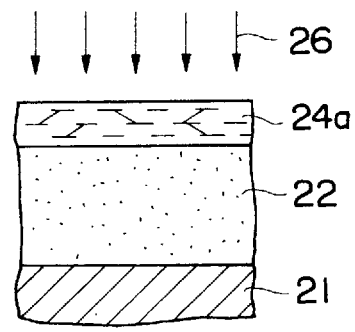
Figure 10C:
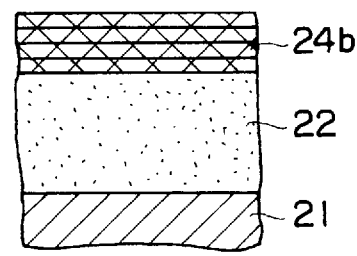

The pattern lithography is carried out as shown in FIGS. 10A through 10G. After a resist 22 is applied on a silicon substrate 21 in an usual manner to conduct the pre-bake, the aforementioned polymer solution 24 is applied thereon (FIG. 10A). This is irradiated with light 26 having a wavelength of 488 nm in the quantity of irradiation of 10 mJ/cm² by means of a mercury lamp provided in a coater developer, so as to form a partially cross-linked polymer solution (sol state) 24a (see Fig. 10B). Thereafter, this solution 24a is cooled to form a hydrogel film 24b (see FIG. 10C). Furthermore, the thickness of this hydrogel film 24b is 70 nm, and the refractive index thereof approximated to 1.3 since the components of the hydrogel film 24b are almost water.

Figure 10D:
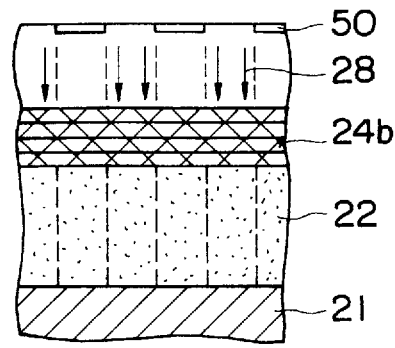
Figure 10E:
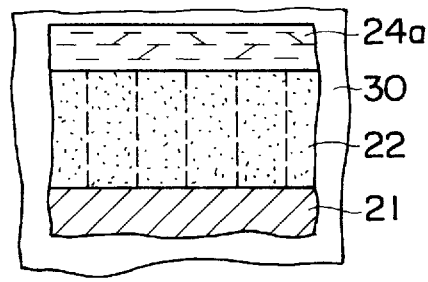
Figure 10F:
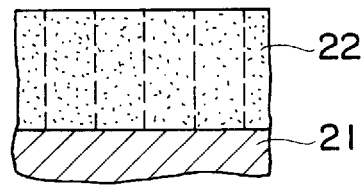
Figure 10G:
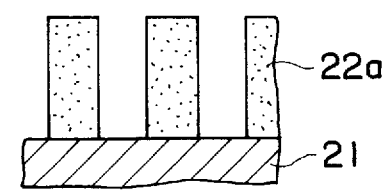

Then, after the mask alignment is carried out by means of a mask 50, the resist 22 is exposed to light 28 having a wavelength 365 nm (see Fig. 10D). Thereafter, the hydrogel film 24b is changed to the original PVA-OQQ film 24a by means of hot water 30, and the PVA-OQQ film 24a is removed (see FIGS. 10E and 10F). Then, the post-exposure bake and the development are conducted to form a resist pattern 22a (see Fig. 10G).

In this case, if the substrate is impregnated with hot water to remove the hydrogel film 24b, this can also serve as the step for post-exposure base. By these procedures, the hydrogel film can be formed in a shorter period of time and in a simpler manner than those of the conventional methods, and it is possible to form a pattern of a high dimensional accuracy which is not under the influence of any differences in level on the substrate, in comparison with when an anti-reflection coating of a hydrogel film is not used.

While the polyvinyl alcohol containing oxystyrylquinolinium groups has been used in the aforementioned preferred embodiment, other materials, such as a polyvinyl alcohol containing stilbazolium groups, may be used as long as the degree of gelation can be adjusted. That is, the photosensitive groups to be introduced are preferably groups which cause a cross-linking reaction by light, such as styrylpyridinium and quinolinium groups.

In addition, since the introduction of the aforementioned photosensitive groups into a polymer is conducted by the acetalization of its formyl substitution product, the polymer has preferably many hydroxyl groups in its structure and can be formed as a gel. For example, polyvinyl alcohols and polysaccharide polymers such as starch and agarose are preferred.

In addition, while the rate of the photosensitive groups introduced into the polymer has been 0.8 mol% and the concentration of the aqueous solution has been 5 wt% in the aforementioned preferred embodiment, other introduction rates and concentrations may be used as long as the cross-linking reaction does not proceed to such an extent that gelation occurs even if the polymer is sufficiently irradiated with light, and as long as the formed hydrogel film can have an ideal refractive index.

Moreover, while the wavelength of light for cross-linking reaction has been 488 nm and the quantity of irradiation has been 10 $mJ/cm^2$ in the aforementioned preferred embodiment, other wavelengths and quantities of irradiation may be used as long as the polymer solution can be cross-linked on the aforementioned conditions.

In the aforementioned fourth preferred embodiment, while the wavelength of light for cross-linking the polymer to form the hydrogel film has been different from the wavelength of light to which the resist was exposed, the same wavelength may be used as long as the cross-linking of the polymer has no influence upon the resist.

In addition, while the cross-linking by light has been first conducted, and then, the gelation has been conducted by the variation in temperature, the order of gelation may be reversed.

Moreover, while the chemical reaction by light has been used as means for irreversible cross-linking, other means such as a reaction using a cross-linking agent may be used as long as it is a system that the density of cross-linked points can be suitably determined. For example, glutaric aldehyde, dicarboxylic acid or the like may be allowed to react with a polymer having hydroxyl groups, such as a polyvinyl alcohol and a polysaccharide polymer, so as to allow the polymer chains to react with each other to be cross-linked, and then, the gelation may be reversibly conducted by the variation in temperature and so forth.

Alternatively, for example, if a sol is formed by mixing, for example, polyacrylamide in which gelation occurs by covalent bonds, with a gelatin which causes the reversible sol-gel transformation, to conduct gelation by the variation in temperature, it is possible to conduct gelation in a shorter period of time than when the gelation of only gelatin is conducted.

In addition, while the wavelength of the light for exposure has been 365 nm in the aforementioned preferred embodiment, other wavelengths may be used as long as the anti-reflection coating fulfills the aforementioned conditions on the anti-reflection.

In the aforementioned fourth preferred embodiment, the photo cross-linking reaction has been used as means for irreversible cross-linking. The following three types of photo cross-linking hydrous polymers are known:

(a) a mixture of a water-soluble polymer and a photo cross-linking agent, (b) a mixture of a water-soluble polymer, a vinyl monomer and a photo polymerization initiator, and (c) a water-soluble polymer bonded to photosensitive groups.

Among these three types of hydrous polymers, the photo cross-linking reactions of the hydrous polymers (a) and (b) are radical reactions, so that it is difficult to control the reaction. On the other hand, in the hydrous polymer (c), the degree of cross-linking can be adjusted by the charge of the photosensitive groups and the light exposure, so that the hydrous polymer (c) is preferably used as the anti-reflection coating.

With respect to the hydrous polymer (c), as examples of water-soluble polymers serving as base polymers, there are gelatin, PVAs (polyvinyl alcohols), polyvinyl pyrrolidones and so forth. As examples of photosensitive groups, there are cinnamic acid group, a-phenylmaleimide group, allylidene acetophenone group, chalcone group, styryl quaternary photosensitive groups (e.g. styrylpyridinium group (SbQ), styrylquinolinium group (QQ), hydroxystyryl pyridinium group (OSbQ), oxystyrylquinolinium group (OQQ) and styrylbenzothiazolium group), cinnamylidene group, anthracene group, furylacrylic acid group, azido photosensitive groups, and nitro group. If the photosensitive group is selected so that the maximum value of photosensitive wavelengths of the photosensitive group deviates as large as possible from the exposure wavelength for the resist, the oxystyrylquinolinium group (maximum wavelength: 422 nm) having the structure as shown in FIG. 11 and the styryl photosensitive groups having the structures as shown in FIGS. 12A through 12C may be selected.

With respect to the aforementioned hydrous polymer (a), as examples of the base polymers, there are PVA and polyvinyl pyrrolidone, and as examples of the photo cross-linking agents, there are ammonium chromate, diazo resin and bisazido.

FIG. 13 shows examples of hydrous polymers cross-linked by chemical reactions. The cross-linking agents for these hydrous polymers are determined in accordance with the type of the functional group of the base polymer.

Examples of the water-soluble polymers will be shown below.

As examples of polysaccharides of natural polymers (containing semi-synthetic polymers), there are starch, galactomannnan, cellulose derivatives (methyl cellulose, nitro cellulose, hydroxypropyl cellulose and so forth), dextrin, pectic acid, pectinic acid, alginic acid, carrageenan, proteoglycan, glycoprotein, chitin derivatives (such as chitosan), mucopolysaccharides such as hyaluronic acid, pectin, gum arabic, galactomannnan, glucomannan, gellan gum, xanthane gum, starch derivatives, alginic acid derivatives, quince seed, tragacanth gum, chondroitin sulfuric acid derivatives and so forth. As examples of proteins of natural polymers, there are gelatin, albumin, casein, histone, protamine, actin, tubulin, insulin, fibrin, myosin, collagen and so forth.

As examples of synthetic polymers, there are polyvinyl alcohols, polyacrylic acids, polyacrylic amides, polyvinyl pyrrolidones, polyethylene oxides, polyvinylmethyl ethers, polydimethyl acrylamides, and various copolymers thereof, polyethylene glycols, polyethylene imines, water-soluble nylons, and polypeptides and polyamino acids containing amino groups, carboxyl groups, hydroxyl groups or the like as residues, and so forth.

Then, before describing the first preferred embodiment of a substrate processing apparatus according to the present invention, the problems when the hydrous polymers used in the pattern lithography method in the aforementioned first through fourth preferred embodiments are applied by means of a conventional spin coater as shown in FIG. 14, will be described below. Furthermore, in FIG. 14, a substrate (wafer) is held on a supporting base which rotates with a rotating shaft, and a hydrous polymer is applied on the substrate while rotating the substrate.

When the aforementioned anti-reflection coating of a hydrous polymer is formed on the substrate by means of such a conventional spin coater, there are the following problems.

That is, (a) the gelation of a solution serving as a precursor of an anti-reflection coating occurs in a vessel filled with the solution or in a line for supplying the solution to the surface of the substrate, so as to block the line and to form defective films; (b) gel films accumulate on the inner wall of a coater cup and the accumulated gel films are peeled to produce particles which accumulate on the wafer so as to decrease the yield of products; (c) since the substrate on which the aforementioned anti-reflection coating is to be formed has a low temperature approximating to a room temperature, immediately after the solution supplied in a sol state contacts the substrate, the viscosity thereof is increased to cause the non-uniformity of thickness of the film; (d) since moisture is vaporized when the anti-reflection coating is formed by the spin coating, the water content of the film is decreased to lower the anti-reflection performance; and (e) when the aforementioned solution is cooled for each substrate to form a gel, the surrounding air is also cooled, so that moisture in air condenses on a cooling mechanism and a gel film so as to produce defective films.

Therefore, in order to eliminate these problems, a substrate processing apparatus according to the present invention has been made.

Referring to FIGS. 15 through 21, the preferred embodiment of a substrate processing apparatus, according to the present invention, will be described below.

In this preferred embodiment, a 3% by volume of aqueous solution of a gelatin derived from a calf is used as an anti-reflection coating material. With respect to this solution, the temperature causing a sol-gel transformation is previously determined by the falling ball method, so that it is found that a gel is transformed into a sol state at a temperature of 32° C. Therefore, if this solution is maintained at a temperature above 32° C. in a Teflon bottle 78 and a line 82, the material is in a flowing state. In this preferred embodiment, in order to maintain the solution as a sol state at a temperature of 50° C., the following means are carried out.

That is, as shown in FIG. 15, the Teflon bottle 78 having a volume of about 1 litter for storing a gelatin solution is received in a temperature controlling tank 79 so as to be sealed therein. The tank 79 is provided with an inlet 80 and an outlet 81 for hot water, and is connected to an outside recirculating thermostat. From the outside recirculating thermostat, pure water adjusted at a temperature of 50° C. is continuously supplied.

In addition, a line 76 of a vinyl is provided between the bottle 78 and a nozzle 97 so as to surround a chemical line 82 of teflon for transporting the gelatin solution. This line 76 also has an inlet 80a and an outlet 81a which are connected to the outside recirculating thermostat, so that pure water adjusted at a temperature of 50° C. is designed to be circulated through the double line.

While the temperature in the pipeline is maintained by the temperature adjusted water in this preferred embodiment, other fluids may be used as a heating medium. The fluid may be either of a liquid or a gas. For example, liquids such as water, water containing an additive for raising the boiling point, ethylene glycol, diethylene glycol, silicone oil and aliphatic hydrocarbons, and gases such as air, nitrogen, argon and water vapor can be heated to be used. The anti-reflection coating material is preferably a solution in a sol state, and the temperature of the fluid for heating can be preferably raised to the extent of the boiling point of water. In addition, in a case where parts of complex shapes such as a bellows pump, a filter and a valve are provided in the line 82, the line 76 may have the structure for covering these parts so as to allow a hot gas to flow through a space between these parts and the line 82. As examples of these gases, there are preferably air, inert gases such as argon, nitrogen, neon and helium, and mixtures thereof.

In addition, in this preferred embodiment, pure water 84 is supplied to the interior of a nozzle receiving portion 83. Since the hot pure water supplied to this portion directly contacts the nozzle 97, it is undesired to directly utilize the circulating water like that used for adjusting the temperature in the pipeline because of contamination. Therefore, in this preferred embodiment, as shown in FIG. 16, line pure water supplied to a clean room is transported into a pure water tank 86 in a thermostat 85 so as to allow the pure water to have a desired temperature in this tank, and then, it is fed to the nozzle receiving portion 83.

Furthermore, a coiled pipe may be substituted for the pure water tank 86. In this case, the heating efficiency can be improved, and temperature adjusted pure water can be continuously supplied.

Figure 18:
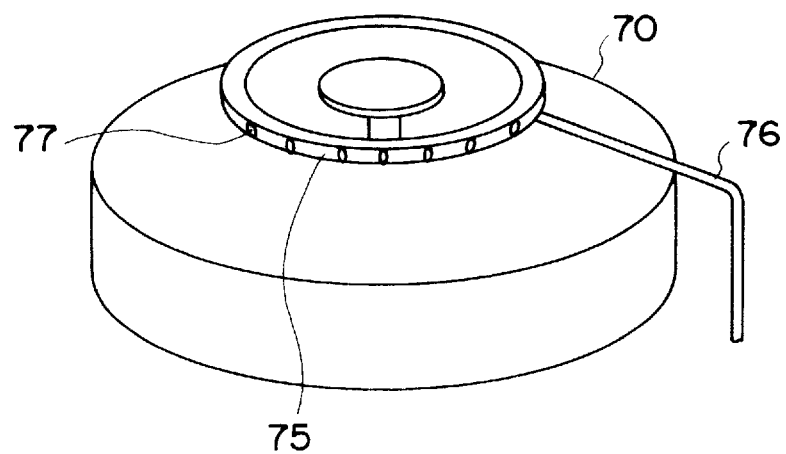
FIG. 18 is a perspective view of the spin coater of FIG. 17.

In this preferred embodiment, the reference number 75 in FIG. 15 denotes a hot-water supplying pipe having a plurality of pores, through which hot water flows out of the pipe to wash the anti-reflection coating material adhered to the wall of a cup. FIG. 17 illustrates a cross-section of a coater cup provided with this washing mechanism. The hot-water supplying pipe 75 serving as the washing mechanism is a doughnut-shaped pipe provided on the upper walls of the inside and outside cups, and has a plurality of pores 77 having a diameter of about 1 mm for discharging hot water. FIG. 18 is a perspective view of the inside cup 70 on which the hot-water supplying pipe 75 is mounted. In FIG. 18, hot water is supplied to the hot-water supplying pipe 75 via the line 76, and then, it flows out of the hot-water supplying pipe 75 through the pores 77 to wash the wall surface of the cup. The same mechanism is provided on the inner wall of the outer cup.

Thus, it is possible to prevent a gel film from accumulating on the inner wall of the coater cup, and to prevent the yield of products from being decreased.

The temperature adjusted water which is used in this washing mechanism has a temperature adjusted in the same manner as that of hot water supplied to the nozzle receiving portion 83 as mentioned above.

In addition, in this preferred embodiment, a nozzle 94 for supplying hot water to the surface of the substrate is provided. The temperature of the substrate is adjusted at 50° C.

by supplying pure water adjusted at 50° C. to the substrate, before supplying the anti-reflection coating material thereto. The method for adjusting the temperature of the substrate should not be limited thereto. For example, the spin chuck itself may be provided with a heating mechanism, such as a resistance wire embedded therein, to maintain at 50° C., and the substrate previously heated at 50° C. by means of a hot plate may be fed to the spin chuck. Thus, it is possible to obtain a film of an uniform thickness.

Furthermore, in FIG. 15, the hot water nozzle 94 and the chemical nozzle 97 move to the central portion of a wafer 69 for spraying the liquid.

Figure 19:
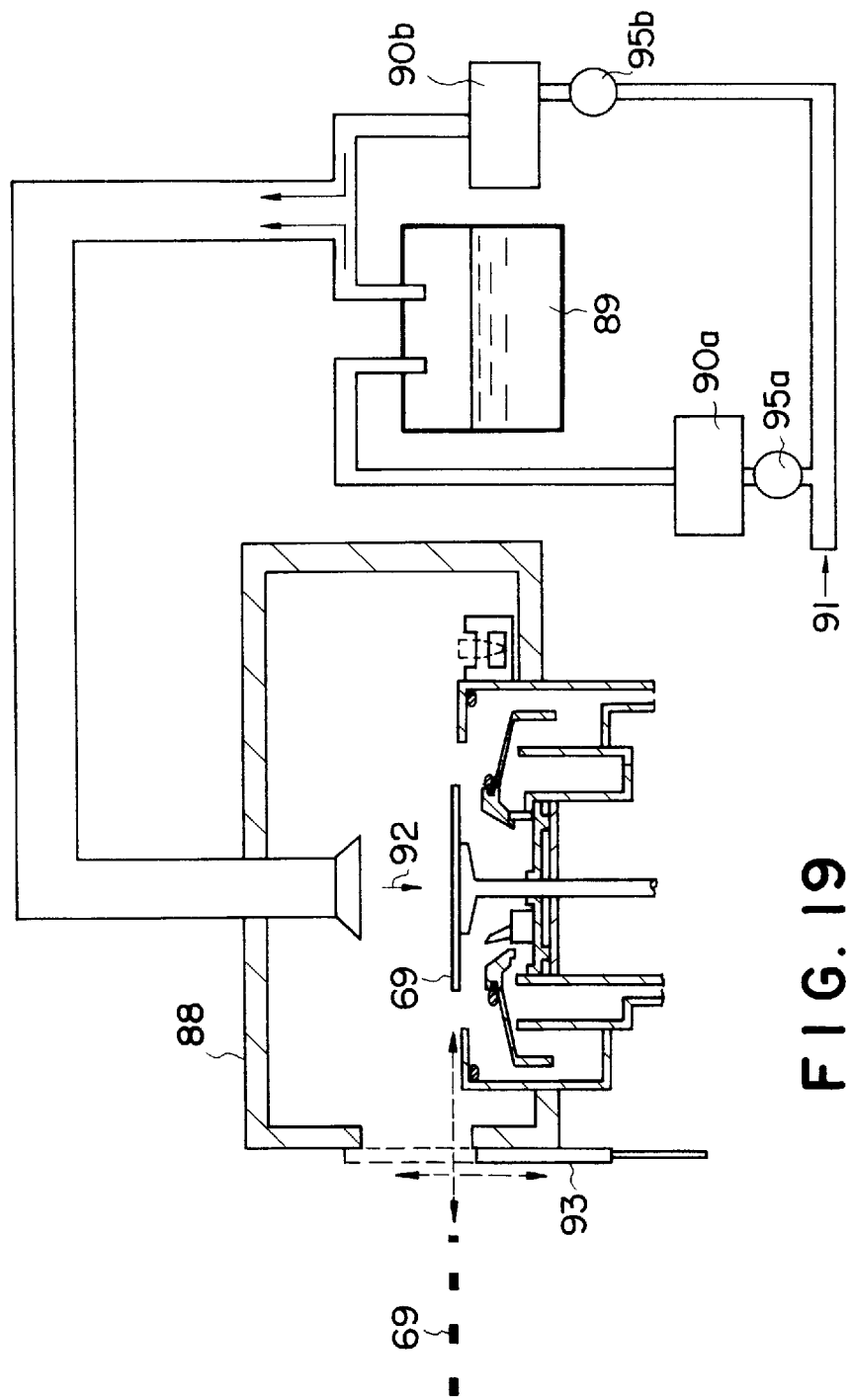
FIG. 19 is a view illustrating a humidity adjusting mechanism in the spin coater of the substrate processing apparatus according to the present invention.

Moreover, in the substrate processing apparatus in this preferred embodiment, the spin coater is provided with a mechanism for preventing moisture from leaving the rotating film during the application process by filling the portion near the substrate 69 with moist air. For example, as shown in FIG. 19, the coater cup portion is surrounded by a partition wall 88. When the wafer 69 is carried, a gate valve 93 is open or closed, and the moist air 92 is fed to the interior of the partition wall 88 while the gate valve 93 is closed. This moist air can be obtained by mixing air humidified by feeding dry air 91 into a saturated bath 89 through a valve 95*a*, with dry air fed through a valve 95*b*. Furthermore, the moist air 92 is adjusted by means of the valves 95*a* and 95*b*. While the humidification is accomplished by so-called separation method in this preferred embodiment, other various method, such as the two-temperature method, the two-pressure method and the saturated salt method, may be utilized. If the partial pressure of water vapor in the moist air fed to the portion near the substrate 69 is higher than the saturated aqueous vapor pressure at a temperature of the portion near the substrate 69, it is possible to prevent the moisture of the anti-reflection coating material from being evaporated during the formation of a film. However, it is too high, the liquefied water is adhered to the surface of the film and the respective portions of the coater, so that foreign matters represented by mist may be produced. For that reason, a ratio Pt/Ps of the partial pressure Pt of the water vapor in air surrounding the substrate to the partial pressure Ps of the water vapor in the supplied moist air is preferably adjusted so as to be in the range of from about 0.9 to about 1.1. Thus, it is possible to prevent the amount of moisture in the film from being decreased, and to prevent the anti-reflection performance from being lowered.

Figure 20:
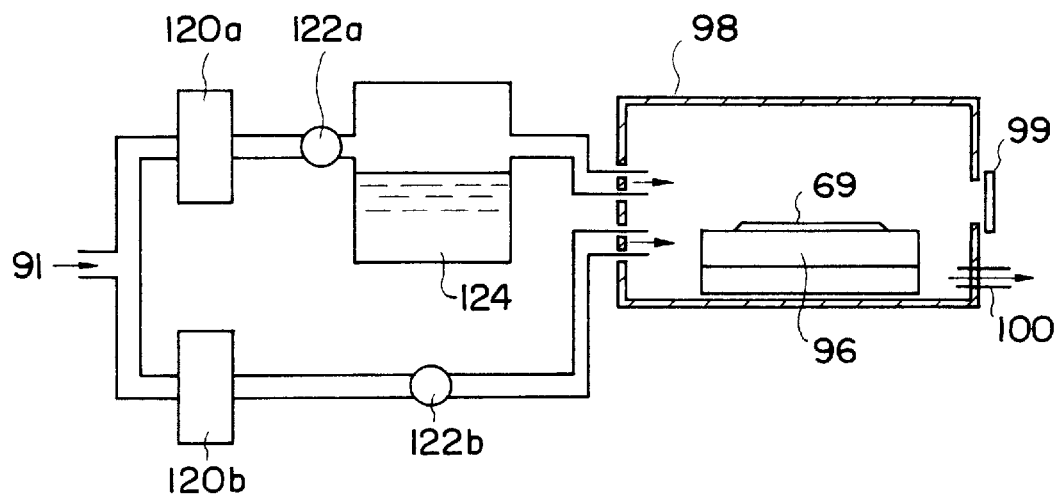
FIG. 20 is a view illustrating a substrate cooling mechanism of the substrate processing apparatus according to the present invention.

When a reversible hydrogel is formed, a method for cooling the film for each substrate after the surface of the substrate is coated with the anti-reflection coating material, is adopted. Since the temperature of gelation is usually lower than a room temperature, if the cooling mechanism is carried on an usual coater/developer, the water vapor contained in air at a room temperature is condensed on the anti-reflection coating and at the portion surrounding the cooling mechanism. In order to prevent this, as shown in FIG. 19, in the substrate processing apparatus in this preferred embodiment, a cooling mechanism 96 which can cool the aqueous film to the freezing point is surrounded by a partition wall 98 so that the amount of water vapor in the space surrounded by the partition wall 98 is maintained to be less than the saturated amount. The substrate 69 is placed on the cooling plate of the cooling mechanism to be cooled. Furthermore, by opening and closing a gate valve 99, the substrate 69 can be put in and out of the space surrounded by the partition wall 98. Air having a humidity adjusted by a humidity adjusting portion provided outside, is introduced into the space surrounded by the partition wall 98. As shown in FIG. 20, the humidity adjusting portion comprises flow meters 120*a* and 120*b*, valves 122*a* and 122*b*, and a saturated bath 124. The dry air 91 is fed to the saturated bath 124 via the flow meters 120*a* and the valve 122*a* so as to be humidified therein, and then, fed to the space surrounded by the partition wall. The dry air 91 is also fed to the space surrounded by the partition wall via the flow meter 120*b* and the valve 122*b* without being humidified. Therefore, the humidity is adjusted on the base of the openings of the valves 122*a* and 122*b*.

For example, in this preferred embodiment, when the film formed on the substance is cooled at 0° C., the dry air may be supplied so that the partial pressure of water vapor in air is less than the saturated aqueous vapor pressure at that temperature, i.e. 0.00603 atm. Specifically, when the temperature of a gas surrounding the cooling plate is 25° C., the saturated aqueous vapor pressure is 0.0325 atm. Therefore, by replacing 82 % of the air surrounding the cooling plate by dry air, it is possible to prevent the condensation or solidification of water even if the temperature drops to 0° C., and it is possible to prevent foreign matters from being produced on the film.

Furthermore, while the humidity is adjusted by the separation method in the substrate processing apparatus in this preferred embodiment, other various method which are known as the two-temperature method, the two-pressure method and the saturated salt method, may be utilized.

Using the substrate processing apparatus in this preferred embodiment which has been described above, a process for forming an anti-reflection coating on a photo resist will be described below.

First, a positive photo resist containing novolac resin and a photosensitive material is formed on the silicon substrate 69 by the spin coating method.

Then, the substrate (wafer) 69 is placed on a hot plate maintained at 95° C., and allowed to stand for 90 seconds.

Then, the gate valve 93 of the spin coater as shown in FIG. 19 is open, and the wafer 69 is carried to the spin chuck portion.

Then, hot (or heated) water maintained at 50° C. is continuously supplied to the wafer 69 for 60 seconds, and thereafter, the substrate is rotated at a speed of 300 rpm to cause excessive water to splash.

Then, the gate valve 93 of the spin coater portion is closed, and the moist air 92 saturated by water vapor at 25° C. is introduced into the spin coater.

Then, a 4*cc* of gelatin solution adjusted at a temperature of 50° C. is dropped on the substrate by means of the chemical supplying nozzle 97, so as to form an aqueous film while rotating the substrate 69.

Thereafter, the supply of the moist air 92 is stopped, and the gate valve 93 is open to carry the substrate to the cooling plate 96 maintained at 0° C.

Then, air having a humidity less than or equal to that of the saturated aqueous vapor pressure at 0° C., which is adjusted by the air humidity adjusting portion as shown in FIG. 20, is supplied to the cooling portion 96.

In this state, the substrate is cooled for 5 minutes to obtain an anti-reflection coating of a gelatin hydrogel.

During this cooling, the nozzle 97 which does not discharge the chemical is held in the nozzle receiving portion 83 as shown in FIG. 15, and the wall surface of the cup is washed by discharging hot (or heated) water from the washing nozzle 75 for 30 seconds. The hot water is adjusted at a temperature above the room temperature.

The thickness of this film was measured by a photo interference type thickness meter, so that it was found that a gel film having a thickness of 60±2 nm was formed on the surface of a 6-inch wafer.

The aforementioned procedures were repeated to form anti-reflection coatings on 100 substrates, so that it was possible to form good films having no dispersion in thickness and no particles of foreign matters.

While a 3 % of aqueous solution of a gelatin derived from a calf has been used as an anti-reflection coating in this preferred embodiment, the present invention should not be limited to this material, and all film materials which can form a film by the spin coating method using an aqueous polymer solution, may be used according to the present invention. Specifically, the present invention can be applied to a suitable concentration of aqueous solution of a material selected from the group consisting of polyvinyl alcohols, polyvinyl phenols, polysaccharides, proteins and derivatives thereof.

In addition, while the portion for receiving the chemical nozzle has been filled with hot water in this preferred embodiment, it may be filled with hot water vapor.

While water used for adjusting temperature and water for washing the cup have been pure water in this preferred embodiment, suitable additives may be added to water if necessary. For example, surfactants for improving the affinity for a resist, sterilizing agents for preventing bacteria from being produced in a solution, boiling-point raising agents, pour point depressants, enzymes for causing organic substances in a waste solution to decompose, and defoaming agents may be added.

Figure 21:
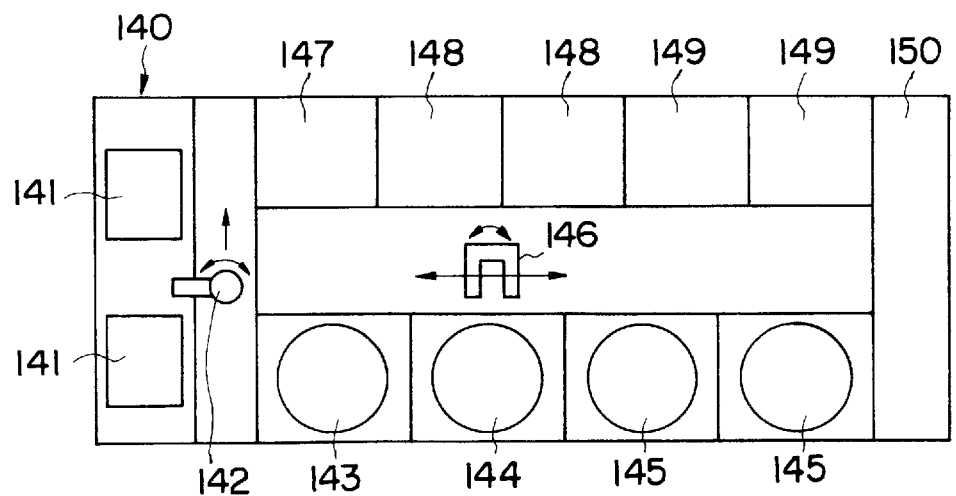
FIG. 21 is a plan view of another preferred embodiment of a substrate processing apparatus according to the present invention.

Furthermore, while the substrate processing apparatus in the aforementioned preferred embodiment has been provided with the anti-reflection coating application unit (the spin coater), the substrate may be processed by a coater developer 140 comprising the combination of an anti-reflection coating application unit with other processing units, as shown in FIG. 21.

In FIG. 21, a substrate fed to a carrier station 141 is carried to an adhesion promoting processing unit 147 by means of a carrier arm 142, to carry out the adhesion promoting processing. This adhesion promoting processing is carried out for promoting the adhesion of the substrate to a photo resist formed thereon. After the adhesion promoting processing is completed, the substrate is carried to a resist coating cup 143 by means of a carrier arm 146, to apply a photo resist on the substrate. The substrate on which the photo resist is applied is transported to a baker 148 by means of the carrier arm 146, to carry out the pre-bake. Thereafter, the substrate is carried to a cooling unit 149 as shown in FIG. 20, to carry out the cooling. After cooling, the substrate is carried to an anti-reflection coating application unit 144 in the aforementioned preferred embodiment, to apply an anti-reflection coating on the substrate. Then, the substrate on which the anti-reflection coating is applied is carried again to the cooling unit 149 by means of the carrier arm 146, to carry out the cooling to form a hydrogel film. The substrate on which the hydrogel film is formed is transported to an exposure unit (not shown) via a delivery portion 150, and the exposure is conducted. Then, the substrate exposed to light is transported to a developing unit 145 via the delivery portion 150, and the development is carried out. After the development is completed, the substrate is carried to the outside via the carrier station 141. If this coater developer as shown in FIG. 21 is used, it is also possible to form an anti-reflection coating having an ideal optical characteristic without decreasing the yield of products.

As mentioned above, according to the pattern lithography method of the present invention, it is possible to accurately form a resist pattern.

In addition, according to the substrate processing apparatus of the present invention, it is possible to form an anti-reflection coating having an ideal optical characteristic without decreasing the yield of products.

What is claimed is:

1. A pattern lithography method comprising the steps of:
   forming a resist film on a substrate;
   applying a hydrous polymer solution on the resist film, said hydrous polymer solution comprising at least one hydrous polymer;
   cross-linking said hydrous polymers in the hydrous polymer solution to form a hydrogel film of a predetermined thickness; and
   pattern-exposing the resist film through the hydrogel film, and then, removing the hydrogel film.

2. A pattern lithography method as set forth in claim 1, wherein said hydrous polymer is selected from the group consisting of polysaccharides, proteins, polyvinyl alcohols and polyacrylamides.

3. A pattern lithography method as set forth in claim 1, wherein said hydrous polymer is a polymer which reversibly causes a sol-gel transformation.

4. A pattern lithography method as set forth in claim 1, wherein said hydrogel film is formed by forming physical bonds between said hydrous polymers in said hydrous polymer solution by a reversible reaction to crosslink the hydrous polymers.

5. A pattern lithography method as set forth in claim 4, wherein said hydrous polymer is selected from the group consisting of polysaccharides, proteins, polyvinyl alcohols and polyacrylamides.

6. A pattern lithography method as set forth in claim 4, wherein said hydrous polymer is a polymer which reversibly causes a sol-gel transformation.

7. A pattern lithography method as set forth in claim 4, wherein said hydrous polymer is a mixture in a sol state formed by mixing a first polymer with a second polymer so that gelation is conducted by an irreversible reaction, and a reversible sol-gel transformation is obtained.

8. A pattern lithography method as set forth in claim 1, wherein said cross-linking step comprises the steps of:
   forming chemical bonds between said hydrous polymers in said hydrous polymer solution by an irreversible reaction to crosslink said polymers so that the density of cross-linked points based on chemical bonds is less than the density of cross-linked points at a gel point of said hydrous polymer; and
   forming physical bonds between said hydrous polymers in said hydrous polymer solution by a reversible reaction to cross-link said polymers.

9. A pattern lithography method as set forth in claim 8, wherein said hydrous polymer is selected from the group consisting of polysaccharides, proteins, polyvinyl alcohols and polyacrylamides.

10. A pattern lithography method as set forth in claim 8, wherein said forming chemical bonds step by the irreversible reaction involves a photo cross-linking reaction and said hydrous polymer is a polyvinyl alcohol, wherein a hydroxyl group in said polyvinyl alcohol is replaced by a photosensitive group.

11. A pattern lithography method as set forth in claim 8, wherein said forming chemical bonds step by the irreversible reaction uses a cross-linking agent.

12. A pattern lithography method as set forth in claim 11, wherein said hydrous polymer is selected from the group consisting of polysaccharides, proteins, polyvinyl alcohols and polyacrylamides.

13. A pattern lithography method as set forth in claim 1, wherein said hydrogel film has a moisture content of at least 80% weight.

14. A pattern lithography method as set forth in claim 1, wherein said removing step includes a step of transforming the hydrogel film into a sol by heating.

15. A pattern prepared by a method according to claim 1.

* * * * *